United States Patent
Yan et al.

(10) Patent No.: US 12,394,554 B2
(45) Date of Patent: Aug. 19, 2025

(54) LOW PROFILE HIGH CURRENT COUPLED WINDING ELECTROMAGNETIC COMPONENT

(71) Applicant: EATON INTELLIGENT POWER LIMITED, Dublin (IE)

(72) Inventors: Yipeng Yan, Pleasanton, CA (US); Dengyan Zhou, Shanghai (CN); Tingjun Zhou, Shanghai (CN)

(73) Assignee: Eaton Intelligent Power Limited, Dublin (IE)

( * ) Notice: Subject to any disclaimer, the term of this patent is extended or adjusted under 35 U.S.C. 154(b) by 588 days.

(21) Appl. No.: 17/395,888

(22) Filed: Aug. 6, 2021

(65) Prior Publication Data
US 2022/0044861 A1 Feb. 10, 2022

(30) Foreign Application Priority Data
Aug. 7, 2020 (CN) .......................... 202010787441.6

(51) Int. Cl.
*H01F 27/28* (2006.01)
*H01F 27/24* (2006.01)
*H05K 1/18* (2006.01)

(52) U.S. Cl.
CPC ............. *H01F 27/28* (2013.01); *H01F 27/24* (2013.01); *H05K 1/181* (2013.01); *H05K 2201/1003* (2013.01)

(58) Field of Classification Search
CPC ........ H01F 27/28; H01F 27/24; H01F 27/306; H01F 27/324; H01F 27/2847; H01F 27/266; H01F 27/29; H01F 27/292
See application file for complete search history.

(56) References Cited

U.S. PATENT DOCUMENTS

| | | | |
|---|---|---|---|
| 7,248,139 B1 | 7/2007 | Podlisk | |
| 7,280,025 B2* | 10/2007 | Sano | H05K 3/3426 336/200 |
| 7,525,406 B1* | 4/2009 | Cheng | H01F 27/306 336/83 |
| 8,058,963 B2* | 11/2011 | Yasuda | H01F 3/12 336/212 |
| 8,174,348 B2* | 5/2012 | Ikriannikov | H01F 27/292 336/200 |
| 8,659,379 B2* | 2/2014 | Yan | H01F 17/04 336/83 |

(Continued)

FOREIGN PATENT DOCUMENTS

| | | |
|---|---|---|
| CN | 101419862 A | 4/2009 |
| CN | 203760299 U | 8/2014 |

(Continued)

*Primary Examiner* — Mang Tin Bik Lian
(74) *Attorney, Agent, or Firm* — Baker Botts L.L.P.

(57) ABSTRACT

A low profile surface mount electromagnetic component for multi-phase electrical power circuitry implemented on a circuit board includes a magnetic core structure and at least one dual-winding arrangement including windings of different thickness but each including an elongated planar main winding section extending linearly across the magnetic core structure. One of the elongated planar main winding sections overlies the other, and a separator element separates the elongated planar main winding sections while the windings remain magnetically coupled to one another.

17 Claims, 9 Drawing Sheets

(56) References Cited

U.S. PATENT DOCUMENTS

| | | | | |
|---|---|---|---|---|
| 10,431,373 | B2* | 10/2019 | Narayanan | H01F 27/2852 |
| 2008/0303624 | A1* | 12/2008 | Yamada | H01F 17/043 |
| | | | | 336/212 |
| 2011/0148559 | A1 | 6/2011 | Ikriannikov | |
| 2011/0148560 | A1* | 6/2011 | Ikriannikov | H01F 27/306 |
| | | | | 336/192 |
| 2017/0047155 | A1* | 2/2017 | Yao | H01F 3/10 |
| 2017/0178795 | A1* | 6/2017 | Todorov | H05K 3/308 |
| 2018/0068778 | A1* | 3/2018 | Narayanan | H01F 3/14 |
| 2019/0108939 | A1* | 4/2019 | Fujimoto | H02M 1/14 |
| 2019/0214181 | A1 | 7/2019 | Wang | |
| 2019/0237245 | A1* | 8/2019 | Ashizawa | H01F 27/255 |
| 2021/0358678 | A1* | 11/2021 | Wang | H01F 27/32 |

FOREIGN PATENT DOCUMENTS

| | | | | |
|---|---|---|---|---|
| CN | 205194485 | U | 4/2016 | |
| CN | 108292556 | A | 7/2018 | |
| CN | 109478457 | A | 3/2019 | |
| CN | 110506316 | A | 11/2019 | |
| WO | WO-2018190075 | A1 * | 10/2018 | H01F 17/06 |
| WO | WO 2019087466 | A1 | 5/2019 | |

* cited by examiner

LOW PROFILE HIGH CURRENT COUPLED WINDING ELECTROMAGNETIC COMPONENT

CROSS REFERENCE TO RELATED APPLICATIONS

This application claims the benefit of Chinese Invention Patent Application No. 202010787441.6 filed Aug. 7, 2020, the disclosure of which is hereby incorporated by reference in its entirety.

BACKGROUND OF THE INVENTION

The field of the invention relates generally to electromagnetic components, and more particularly to a surface mount electromagnetic component having a plurality of magnetically coupled coil windings for circuit board applications.

Electromagnetic components such as inductors and transformers are known that include a magnetic core and one or more conductors defining a coil or winding in the magnetic core. In such components, electrical current flow through the coil(s) or winding(s) in the component generates a magnetic field according to well-known electromagnetic principles that may be harnessed in combination with the magnetic core for desirable purposes in an electrical power distribution system. In an inductor component, the magnetic field(s) can be productively used to store energy in the magnetic core, release energy from the magnetic core, and regulate a voltage output. In a transformer component, current flowing in a first coil or winding can induce a current flow in a second coil or winding to step-up or step-down a voltage input, as well as regulate the voltage output. In some cases, an electromagnetic component may combine the function of a transformer and an inductor component, and in multi-phase power systems the conductors may be magnetically coupled to one another to produce still other desirable effects and advantages in an electrical power distribution system.

For certain applications, the construction of such components can be undesirably complicated and expensive to produce the desired results. Improvements are accordingly desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
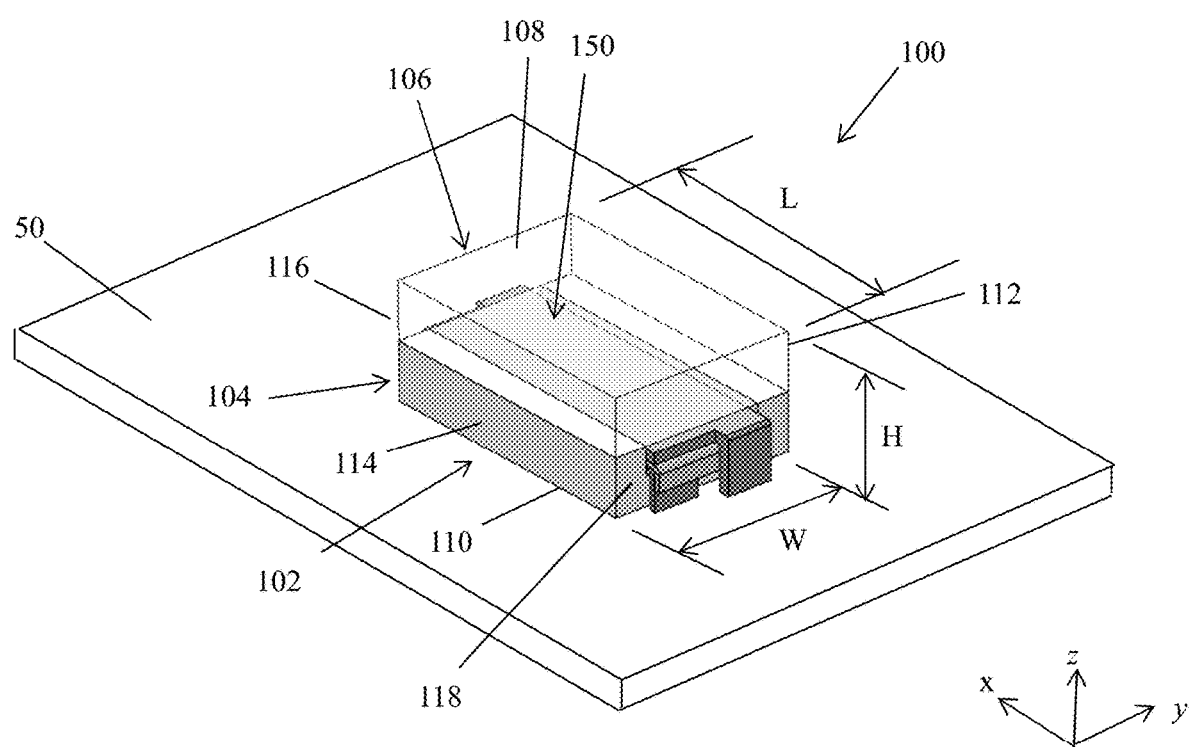
FIG. 1 is a top perspective view of a first exemplary embodiment of a surface mount, electromagnetic component assembly including a plurality of magnetically coupled windings.

In view of industry trends toward smaller electromagnetic components, demands are now imposed on electromagnetic component manufacturers to provide smaller components without comprising performance attributes. Such smaller electromagnetic components can be mounted on a circuit board with increased component density. Demands for increasingly smaller components are difficult to meet in an economical manner, however, for certain applications involving higher-power, higher current circuitry. Certain multi-phase power applications implemented on circuit boards present additional challenges to the industry to provide smaller components with the desired performance capability in reduced package sizes.

For example, multi-phase transformer-inductor voltage regulator (TLVR) modules implemented on circuit boards are desirable in data center applications including servers operating with rapidly fluctuating current reaching high levels. TLVR modules are known that include magnetically coupled windings to provide the desired regulated voltage output, but tend to be complicated and expensive to manufacture in a smaller size without impacting performance considerations. Multiple-phase voltage regulator module (VRM) circuit board components are likewise known that employ magnetically coupled windings which provide desirable performance in various power system applications, but likewise are complicated and expensive to manufacture in a smaller size without impacting performance considerations. Multi-phase transformer components are also known for higher voltage and lower voltage circuit board power system applications that are also complicated and expensive to manufacture in a smaller size without impacting performance considerations.

Electromagnetic components are known for use in multi-phase circuit board applications such as those above that desirably include multiple, magnetically coupled windings integrated in a common core structure that reduce the size of the components relative to discrete components each having a single winding in a separate magnetic core structure. Existing electromagnetic components of this type however, are disadvantaged in some aspects and improvements are desired, particularly for relatively high current, high power multi-phase power systems wherein further size reduction in package size is desired in a cost effective manner.

Embodiments of improved electromagnetic component assemblies are described hereinbelow that are manufacturable at lower cost and in desired package sizes while offering acceptable coupled winding performance for the applications described above. This is achieved at least in part via a number of relatively low cost, simply shaped and easily manufactured modular component parts that may be mixed and matched in different combinations to provide a variety of different electromagnetic components from a small inventory of modular parts. Unique, space saving dual-winding arrangements having distinct windings of different fabrication and thickness are also provided and oriented in a manner in a magnetic core structure to facilitate reduction in the profile of the components of the circuit board relative to conventional electromagnetic component constructions. Method aspects will be in part apparent and in part explicitly discussed in the following description.

Figure 2:
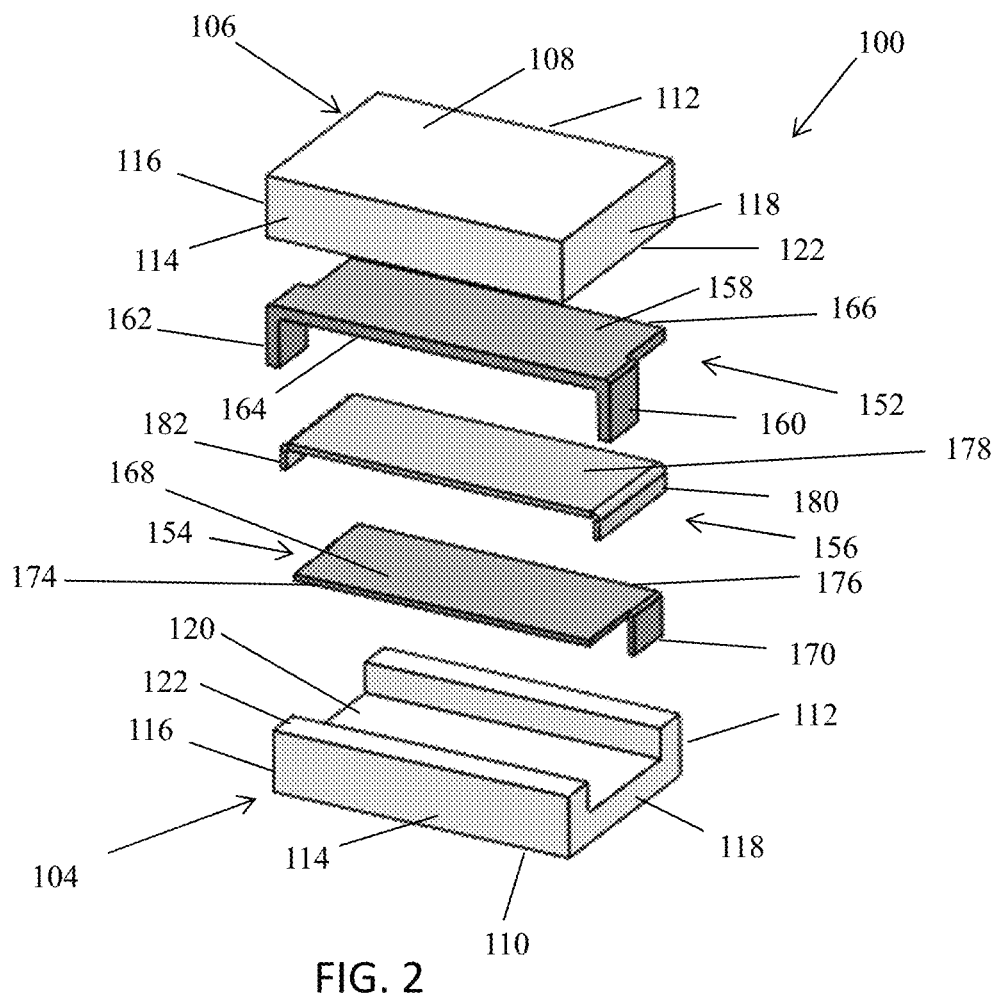
FIG. 2 is an exploded view of the surface mount, electromagnetic component assembly shown in FIG. 2.
Figure 3:
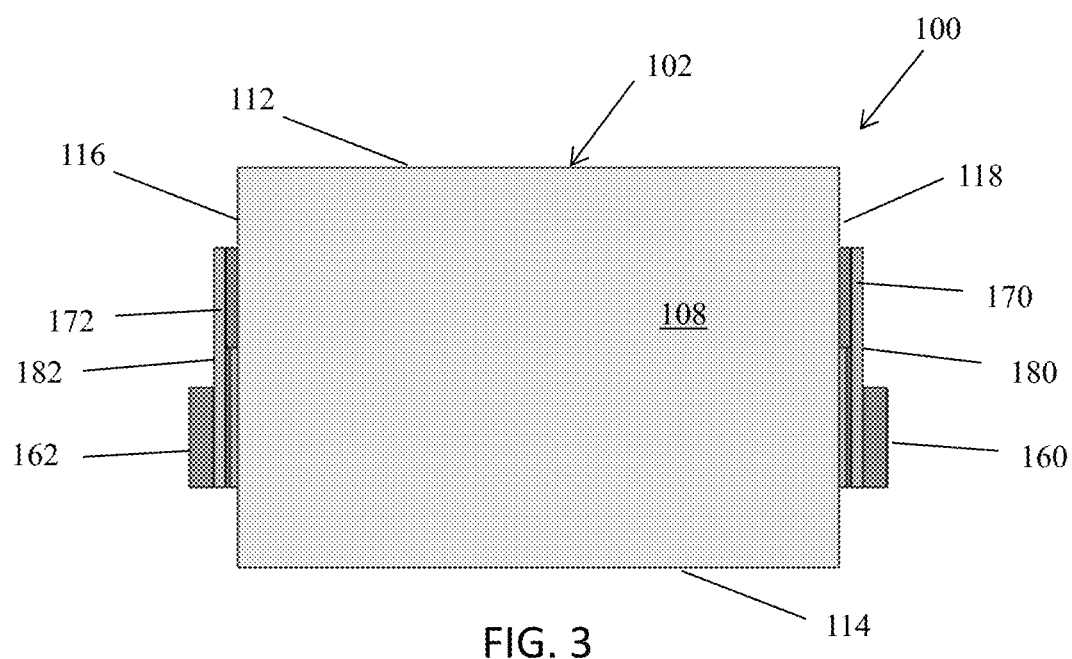
FIG. 3 is a top view of the surface mount, electromagnetic component assembly shown in FIGS. 1 and 2.
Figure 4:
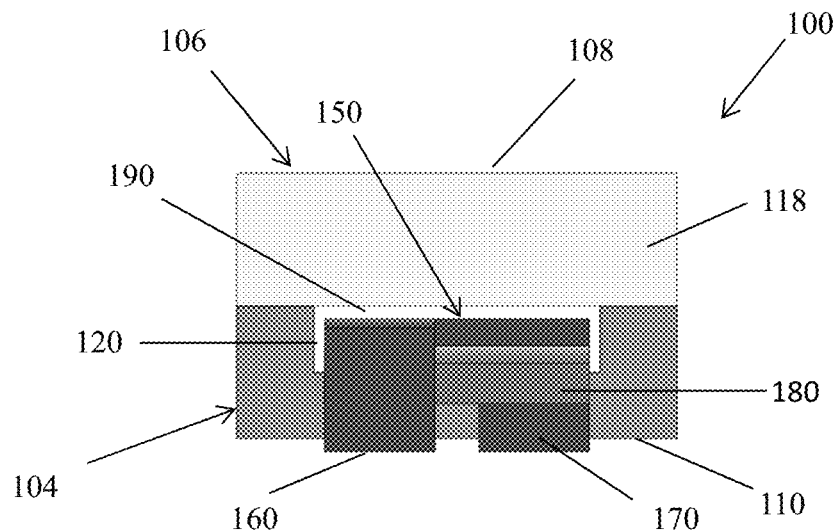
FIG. 4 is an end elevational view of the surface mount, electromagnetic component assembly shown in FIGS. 1 through 3.
Figure 5:
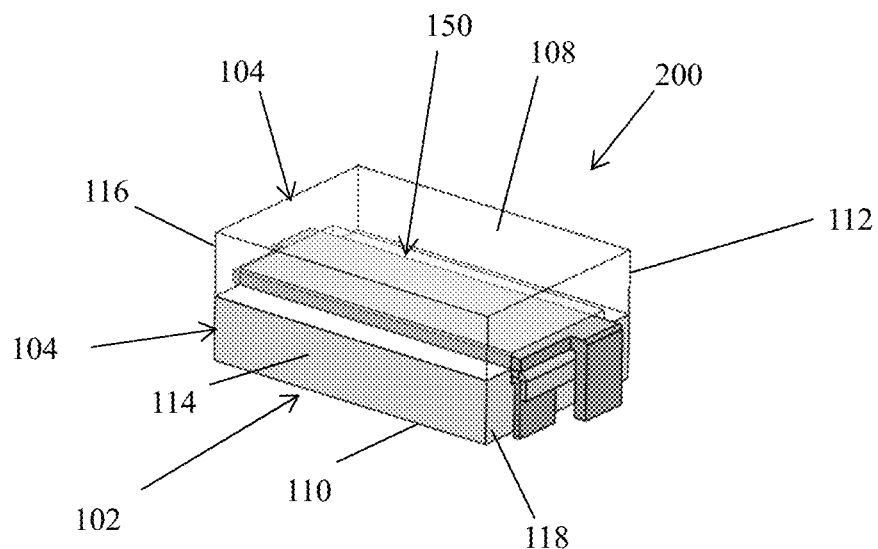
FIG. 5 is a top perspective view of a second exemplary embodiment of a surface mount, electromagnetic component assembly including a plurality of magnetically coupled windings.
Figure 6:
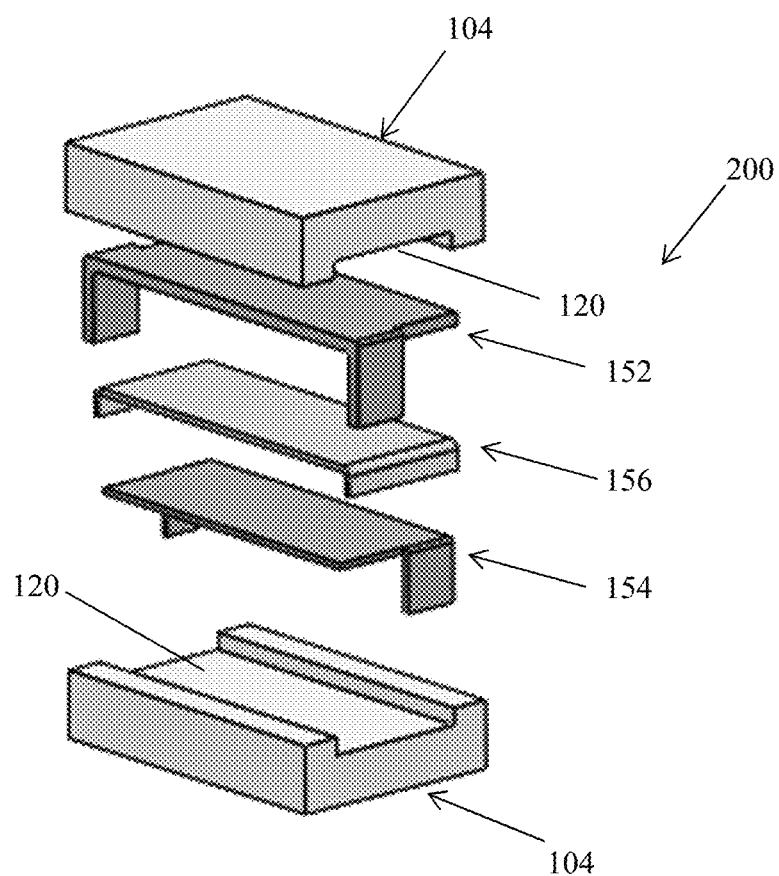
FIG. 6 is an exploded view of the surface mount, electromagnetic component assembly shown in FIG. 5.
Figure 7:
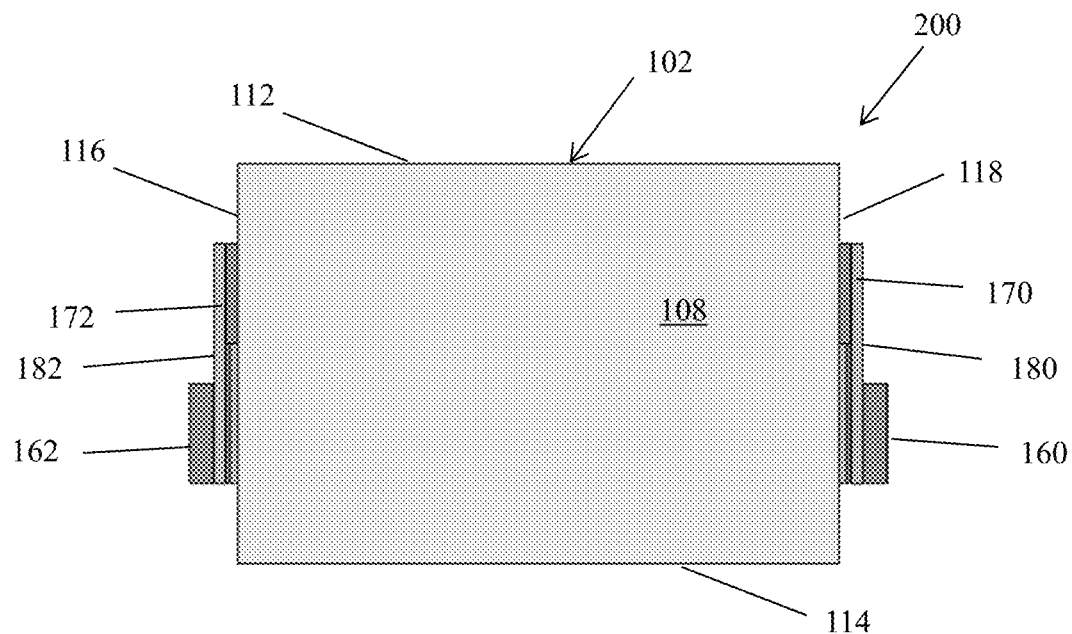
FIG. 7 is a top view of the surface mount, electromagnetic component assembly shown in FIGS. 5 and 6.

FIGS. 1-4 illustrate various views of a first exemplary embodiment of a low profile surface mount, electromagnetic component assembly 100. FIG. 1 shows the electromagnetic component assembly 100 in perspective view. FIG. 2 is an exploded view of the electromagnetic component assembly 100. FIG. 3 is a top view of the electromagnetic component assembly 100, and FIG. 4 is an end view of the electromagnetic component assembly 100.

The electromagnetic component assembly 100 generally includes a circuit board 50, a magnetic core structure 102, and a space saving dual-winding arrangement 150 situated within the magnetic core structure 102.

The magnetic core structure 102 in the example shown is fabricated from first and second magnetic core pieces 104, 106 assembled about the dual-winding arrangement 150. When assembled as shown, the magnetic core pieces 104, 106 in combination define the larger magnetic core structure 102 including a number of generally orthogonal side walls imparting an overall rectangular or box-like shape and appearance. The box-like shape of the magnetic core structure 102 in the illustrated example has an overall length L measured along a first dimensional axis such as an x axis of a Cartesian coordinate system, a width W measured along a second dimensional axis perpendicular to the first dimension axis such as a y axis of a Cartesian coordinate system, and a height H measured along a third dimensional axis extending perpendicular to the first and second dimensional axes such as a z axis of a Cartesian coordinate system. As shown, the height dimension H is much less than the length dimension L and is slightly smaller than the width dimension W.

The dimensional proportions in length, width and height dimensions of the magnetic core structure 102 are selected to reduce the height dimension H as much as possible to produce a so-called low profile component while still achieving adequate performance of the component in use. In higher power, higher current circuitry, as the height dimension H is reduced the dimension L (and perhaps W as well) are increased to accommodate larger coil windings capable of performing in higher current circuitry. Such low profile component configuration is contrasted with alternative electromagnetic component configurations wherein the core structure favors an increased height dimension H to effect a reduction in the L and W dimensions in order to realize a smaller footprint or occupied area on the plane of the circuit board 50 in the x, y plane. Low profile components may realize smaller circuit board assemblies in the z dimension and/or facilitate stacked circuit boards in a reduced space in the z dimension, whereas small footprint components increase component density on the circuit board in the x, y plane or facilitate reduction of the circuit board size in the x and y dimensions.

In a contemplated embodiment, the magnetic core structure 102 may be assembled from modular magnetic core pieces 104, 106 each fabricated utilizing known soft magnetic particle materials and known techniques such as molding of granular magnetic particles to produce the desired shapes. Soft magnetic powder particles used to fabricate the magnetic core pieces may include Ferrite particles, Iron (Fe) particles, Sendust (Fe—Si—Al) particles, MPP (Ni—Mo—Fe) particles, HighFlux (Ni—Fe) particles, Megaflux (Fe—Si Alloy) particles, iron-based amorphous powder particles, cobalt-based amorphous powder particles, and other suitable materials known in the art. In some cases, magnetic powder particles may be coated with an insulating material such that the magnetic core pieces may possess so-called distributed gap properties familiar to those in the art and fabricated in a known manner. The modular magnetic core pieces 104, 106 may be fabricated from the same or different magnetic materials and as such may have the same or different magnetic properties as desired.

The modular magnetic core pieces 104, 106 in the example of FIGS. 1-4 are shaped as discrete and distinct magnetic core pieces arranged on either side of the dual-winding arrangement 150 in a plane parallel to the x, y plane. Each of the magnetic core pieces 104, 106 define about 50% or ½ of the overall height H of the magnetic core structure 102, while having equal length and width dimensions L and W. In the arrangement shown, the core piece 106 defines the entire top wall 108 and the core piece 104 defines the entire bottom wall 110 of the magnetic core structure 102. In the context of the present description, the "bottom" wall 110 of the magnetic core structure 102 is located adjacent the x, y plane of the circuit board 50 and the "top" wall is located at the distance H from the x, y plane of the circuit board 50.

Each core piece 104, 106 defines a portion of the opposing longitudinal side walls 112, 114 interconnecting the top and bottom walls 108, 110 in the magnetic core structure 102. Each core piece 104, 106 also defines a portion of the opposing lateral side walls 116, 118 interconnecting the top and bottom walls 108, 110 in the magnetic core structure 102. In the example shown, each core piece 104 defines about ½ of the overall longitudinal side walls 112, 114 and lateral side walls 116, 118 of the complete magnetic core structure 102 when assembled in the completed component 100.

The core piece 104 includes an elongated straight and linear, longitudinally extending channel 120 formed in an upper surface 122 thereof that extends opposite the generally flat and planar bottom wall 110 in a uniformly spaced relation to the longitudinal sides 112, 114 of the magnetic core piece 104. The channel 120 extends axially or longitudinally in the x direction for the entire length L of the core piece 104 and is approximately centered in the y direction or width direction in the core piece 104 between the longitudinal sides 112, 114. As such, the channel 120 extends axially in a plane parallel to the bottom surface 110 in between the longitudinal sides 112, 114 and is open and accessible from each lateral side edge 116, 118. Further, the channel 120 extends in depth for about half of the height dimension of the core piece 104 in the z direction, and extends in the y direction for more than ½ of the width dimension W of the core piece 104. The proportions of the channel 120 in the x and y direction impart a uniform U-shaped cross-section of the core piece 104 in the x, y plane. As such the core piece 104 is sometimes referred to as a U-core. In use, the bottom wall 110 extends in contact with the circuit board, or extends slightly spaced from but extending generally parallel to the x, y plane of the circuit board 50 in FIG. 1.

The top wall 108 in the core piece 106 is generally flat and planar. A lower wall 122 opposes the top wall 108 and is also generally flat and planar in the core piece 106. The core piece has a uniform rectangular-shaped cross-section of the core piece 106 in the x, y plane. As such the core piece 106 is sometimes referred to as an I-core.

The dual-winding arrangement 150 includes a first conductive winding 152, a second conductive winding 154, and a separator element 156. The first and second conductive windings 152 and 154 are separately fabricated from one another using a known conductive material such as metal or metal alloy familiar to those in the art. The first and second windings 152 and 154 are spaced apart from another in the z direction by the separator element 156 but are still close enough to one another to magnetically couple the windings 152, 154 inside the magnetic core structure 102.

The first winding 152 is fabricated from a relatively thick elongated conductor that may for example, be cut or stamped as an axially elongated strip from a larger and generally planar piece of electrically conductive material and subsequently bent out of plane into the geometry shown including an elongated planar main winding section 158 extending horizontally in the x, y plane and vertically extending legs 160, 162 extending perpendicular to the planar main winding section 158. The main winding section 158 is wider in they direction than the legs 160, 162 such that the legs 160, 162 depend from one longitudinal side 164 of the main winding section 158 but not the other longitudinal side 166. As such, the winding 152 is asymmetrical along the x axis, and has an inverted U-shaped cross-section in the x, z plane where the legs 160, 162 extend and an elongated rectangular-shaped cross-section where the legs 160, 162 do not extend. In the width dimension W, the main winding section 158 is a bit less than the width of the channel 120 in the core piece 104 in the assembled component 420. The winding 152 has a low profile configuration since the axial length of the legs 160, 162 extending in the z direction is much less than the axial length of the elongated planar main winding section 158 in the x direction, and as such the height of the legs 160, 162 is much less than the length of the elongated planar main winding section 158. The low profile of the winding 152 is also lower than the profile of the magnetic core piece 104 in the z direction or height dimension of the component 100.

In contrast to the first winding 152, the second winding 154 is stamped from a relatively thin and planar sheet of conductive material which is then bent out of plane into the geometry shown including a larger planar main winding section 168 extending horizontally in the x, y plane and vertically extending legs 170, 172 extending perpendicular to the planar main winding section 168. The main winding section 168 is wider in the y direction than the legs 170, 172 such that the legs 170, 172 depend from one longitudinal side 176 of the main winding section 168 but not the other longitudinal side 174. The legs 170, 172 of the winding 154 are reversed relative to the legs 160, 162 of the winding 152 such that when the windings 152, 154 are assembled the planar section 158 overlies the planar section 168 but the legs 160, 162 do not overlie the legs 170, 172 because they extend from different longitudinal sides of the dual-winding arrangement 150. Instead, the legs 160, 162 and the legs 170, 172 are laterally offset from one another on the opposing sides 116, 118 of the magnetic core structure 102 as seen in FIGS. 1-3 and 4.

The winding 154, like the winding 152, is asymmetrical along the x axis, and has an inverted U-shaped cross-section in the x, z plane where the legs 170, 172 extend and an elongated rectangular-shaped cross-section where the legs 170, 172 do not extend. In the width dimension W, the main winding section 168 is a bit less than the width of the channel 120 in the core piece 104 in the assembled component 100. The winding 154 has a low profile configuration since the axial length of the legs 170, 172 is much length than the axial length of the elongated planar main winding section 168. Also, the legs 170, 172 of the winding 154 are shorter in the z direction than the legs 160, 162 of the winding 152 such that the winding 154 has a lower profile than the winding 152.

The windings 152, 154 are rather simply shaped and may therefore be fabricated at relatively low cost. The magnetic core pieces 104, 106 are likewise rather simply shaped and may be fabricated at low cost. The windings 152, 154 may further be fabricated in advance as separate elements for assembly with the modular magnetic core pieces described. That is, the windings 152, 154 may be pre-formed in the shape as shown for later assembly with the magnetic core pieces. Each winding 152, 154 defines less than one complete turn in the magnetic core and 102 and are therefore less complicated to manufacture and more easily assembled in the magnetic core structure than larger and more complex multi-turn windings in the magnetic core structure.

The separator element 156 may be fabricated from a magnetic or non-magnetic material to achieve the desired amount of magnetic coupling between the windings 152 and 154. The separator element 156 is formed as a symmetrical element having a uniform inverted U-shaped cross section in the x, z plane. The separator element 156 has a large planar main section 178 extending horizontally and vertical legs 180, 182 depending from the ends of the main section 178 and perpendicularly to the planar main section 178. In the assembled component 100, the main section 178 of the separator element lies directly between and in contact with the main winding section 158 of the first winding 152 and the main winding section 168 of the second winding 154 inside the channel 120 in the core piece 104. The separator element 156 further has a low profile since the axial length of the legs 180, 182 is much less than the axial length of the elongated planar main winding section 178. Also, the legs 180, 182 of the separator element 156 are shorter in the z direction than the legs 160, 162 of the winding 152 and are also shorter than the legs 170, 172 of the winding 154, such that in the final assembly of the component 100 the legs 180, 182 of the separator element 156 do not extend to the bottom wall 110 of the component 100 as the legs of the windings 152, 154 do as shown in FIGS. 1 and 4.

In the example shown, the second winding 154, the separator element 156 and the first winding 152 have the same width but increasing length in the x direction relative to one another such that they may be received one over the other on the core piece 104 in an overlying relationship and bonded together in the assembly of the component 100. In the assembly of the component, the main winding section 168 of the second winding 154 is placed in the channel 120 of the core piece 104 while the legs 170, 172 extend over the ends 116, 118 of the core piece 104 with the legs 170, 172 off center on the core piece 104 such that they are closer to the longitudinal side wall 112 than the longitudinal side wall 114. As best seen in FIG. 3, the legs 170, 172 protrude from the end walls 116, 118 by a first amount. The first amount is about equal to the thickness of the conductor used to fabricate the second winding 154. The winding 154 is bonded to the channel of the magnetic core piece 104 to affix it in place.

With the winding 154 in place, the separator element 156 is received over the second winding 154 and the core piece 104. The main section 178 of the separator element 156 directly overlies the main winding section 168 in the channel 120, and the legs 180, 182 of the separator element 156 extend over the legs such that the separator element legs 180, 182 extend exterior to the legs 170, 172 of the second winding 154 and the legs 170, 172 of the second winding 154 are interior to the separator element legs 180, 182 in the assembly on each side 116, 118 of the magnetic core structure 102. The separator element legs 180, 182 protrude from the end walls 116, 118 by a second amount greater than the first amount as seen in FIG. 3. The second amount is about equal to the combined thickness of the conductor used to fabricate the second winding 154 and the thickness of the separator element 156. The separator element 156 is bonded to the winding 154 to affix it in place.

With the winding 154 and the separator element 156 in place, the first winding 152 is received over the separator element 156 in the channel 120 of the core piece 104. The main section 158 of the first winding 152 directly overlies the main section 178 of the separator element 156 in the channel 120, and the legs 160, 162 of the first winding 152 extend over the legs 180, 182 of the separator element 156. As such, the winding legs 160, 162 extend exterior to the separator legs 180, 182 and the separator legs 180, 182 are interior to the winding legs 160, 162 in the assembly on each side 116, 118 of the magnetic core structure 102. The legs 160, 162 of the winding 152 protrude from the end walls 116, 118 by a third amount greater than the second amount as seen in FIG. 3. The third amount is about equal to the combined thickness of the conductor used to fabricate the second winding 154, the thickness of the separator element 156, and the thickness of the conductor used to fabricate the first winding 152. The winding 152 is bonded to separator element 156 to affix it in place.

While described above the dual-winding arrangement 150 is assembled on the magnetic core piece in sequence via individual application of the winding 154, separator element 156 and winding 152 the dual-winding arrangement 150 may alternatively be separately assembled and inserted over the magnetic core piece 104 and bonded thereto as a previously completed sub-assembly. The component 100 is completed by installing the magnetic core piece 106 over the dual-winding arrangement 150 and the magnetic core piece 104 and bonding it in place. The winding 154 of reduced thickness relative to the winding 152 lowers the profile further than an embodiment having two windings of the same thickness, while the main sections 158, 168 provide a relatively large cross-sectional area to capably handle higher-current, higher power applications and perform well with the windings 152, 154 being desirably magnetically coupled. The thickness of the separator element 156 may be varied to increase or reduce the degree of magnetically coupling as desired, while preventing shorting of the windings 152, 154.

When the dual-winding arrangement 150 is completely assembled, the legs 160, 162 of the first winding 152 extend off center on the core piece 104 and are closer to the longitudinal side wall 114 than to the longitudinal side wall 112 of the magnetic core structure 102 as shown in FIGS. 2 and 3. However, the separator element legs 180, 182 are substantially centered on the end walls 116 and 118 and are evenly spaced from the longitudinal side walls 112, 114. The legs 170, 172 of the second winding 154 are off centered and extend closer to the longitudinal side wall 112 than the longitudinal side wall 114. In the z direction, the legs 160, 162 of the first winding 152 and the legs 170, 172 extend to the bottom wall 110 where they may be surface mounted to the circuit board 50 according to known techniques.

As shown in FIG. 4, the dual-winding arrangement 150 is completely assembled in the channel 120 and is centered therein in the width dimension with the longitudinal sides of the windings 152, 154 and separator element 156 aligned vertically in the channel 120 of the magnetic core piece. Since the width of the dual-winding arrangement 150 is a bit less than the width of the channel 120, a physical air gap 190 extends between the dual-winding arrangement 150 and the sides of the channel 120 and also between the upper edge of the dual-winding arrangement 150 and the core piece 106. Except for the legs in the dual-winding assembly, the remainder of the dual-winding arrangement 150 is contained in the core piece 104 and is covered and is protected by the core piece 106 in the completed magnetic core structure 102. The ends of the dual-winding arrangement 150 on the lateral side walls 116, 118 are exposed, however, in the assembled component 100 on the walls 116, 118.

The circuit board 50 is configured with multi-phase power supply circuitry, sometimes referred to as line side circuitry including conductive traces (not shown) provided on the plane of the circuit board in a known manner. In the example shown in FIG. 1, the line side circuitry provides two phase electrical power, and in contemplated embodiments a first conductive trace corresponds to a first phase of the multi-phase power supply circuitry and a second conductive trace corresponds to the second phase of the multi-phase power supply circuitry. In turn, the windings 152, 154 of the component 100 are connected to the first and second conductive traces via surface mounting of the respective winding legs provided on the side 116 of the magnetic core structure 102. Circuit traces are also included on the circuit board 50 to establish electrical connection to load side circuitry 118 downstream from the conductive windings 152, 154 on the circuit board 50 when the legs provided in the dual-winding arrangement 150 on the side 118 of the magnetic core structure 102 are surface mounted to the load-side circuit traces.

While a two phase power system has been described, greater numbers of phases in the multi-phase power supply circuitry may alternatively be provided as illustrated in some of the following embodiments including additional dual winding arrangements 150. That is, and as explained below, the component may alternatively be configured in modular form for four, six or eight phase power systems. The modular concept is generally scalable to accommodate any number of windings and corresponding phases of electrical power.

It is understood that more than one electromagnetic component 100 may also be provided on the circuit board 50 as desired. Other types of circuit components may likewise be connected to the circuit board 50 to complete, for example, a power regulator circuit and/or a power converter circuit on the circuit board 50. Multi-phase power applications such as multi-phase transformer-inductor voltage regulator (TLVR) circuitry, voltage regulator module (VRM)

circuitry and multi-phase transformer circuitry may benefit from the coupled windings in the component 100 to reduce the size, complexity and expense of the power distribution system. As TLVR and VRM circuitry is generally known and within the purview of those in the art, no further description of the circuitry is believed to be necessary.

FIGS. 5 through 8 are various views of a second exemplary embodiment of a low profile surface mount electromagnetic component assembly 200 that may be used in addition to or in lieu of the component 100 described above on the circuit board 50.

The component 200 is similar to the component 100 but omits the modular magnetic piece 106 in the component 100 in favor of another modular magnetic core piece 104 in the component 200. Thus, while the component 100 has one U-core piece 104 and one I-core piece 106, the component 200 has two U-core pieces 104 that in combination define the larger magnetic core structure 102.

Figure 8:
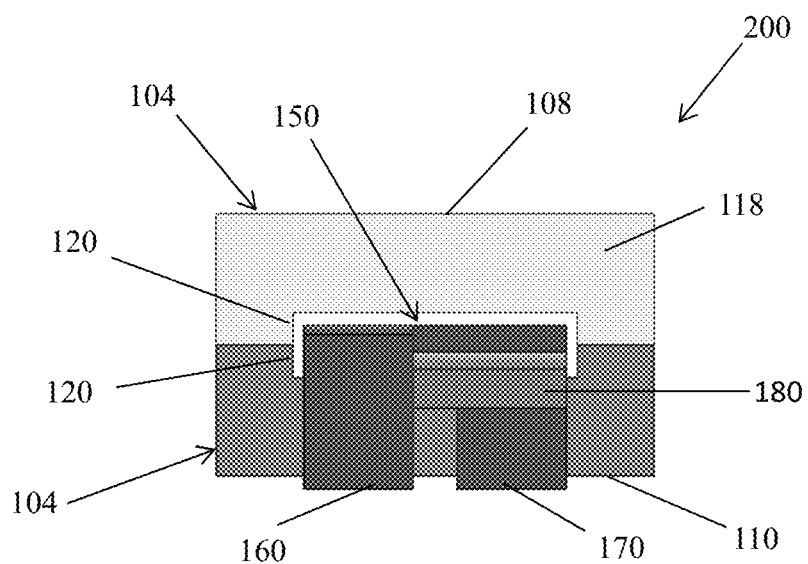
FIG. 8 is an end elevational view of the surface mount, electromagnetic component assembly shown in FIGS. 5 through 7.
Figure 9:
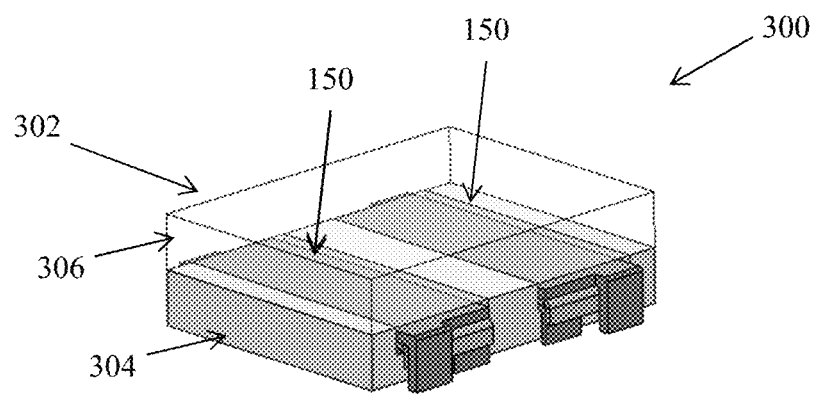
FIG. 9 is a top perspective view of a third exemplary embodiment of a surface mount, electromagnetic component assembly including a plurality of magnetically coupled windings.
Figure 10:
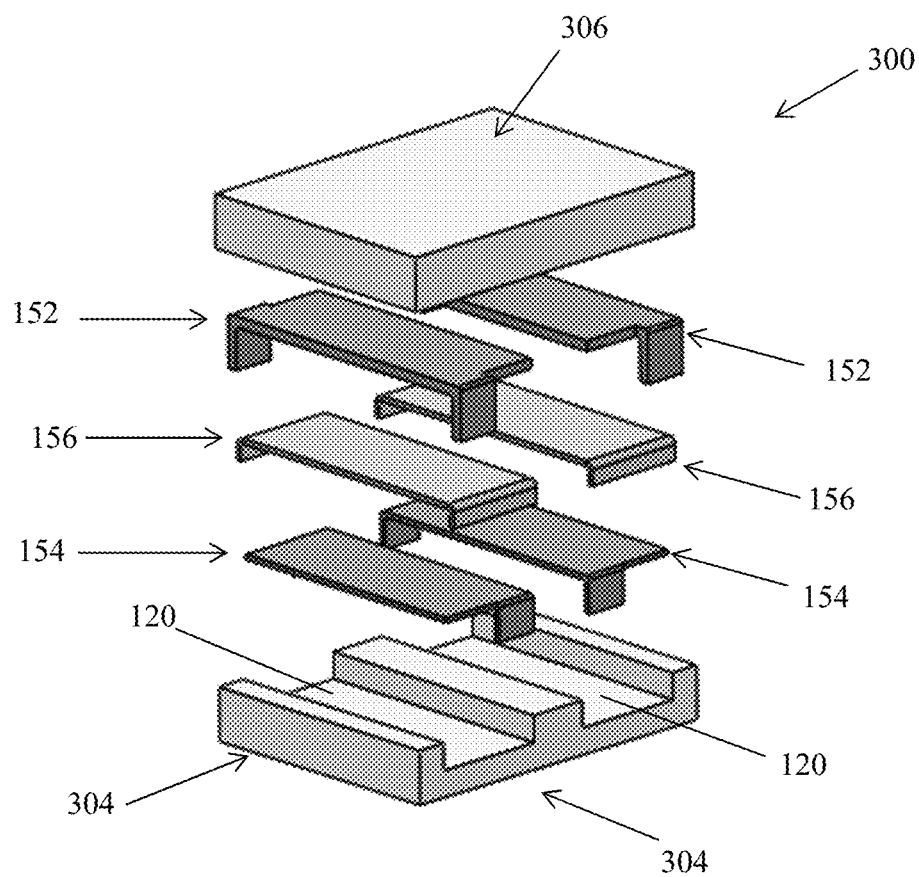
FIG. 10 is an exploded view of the surface mount, electromagnetic component assembly shown in FIG. 9.
Figure 11:
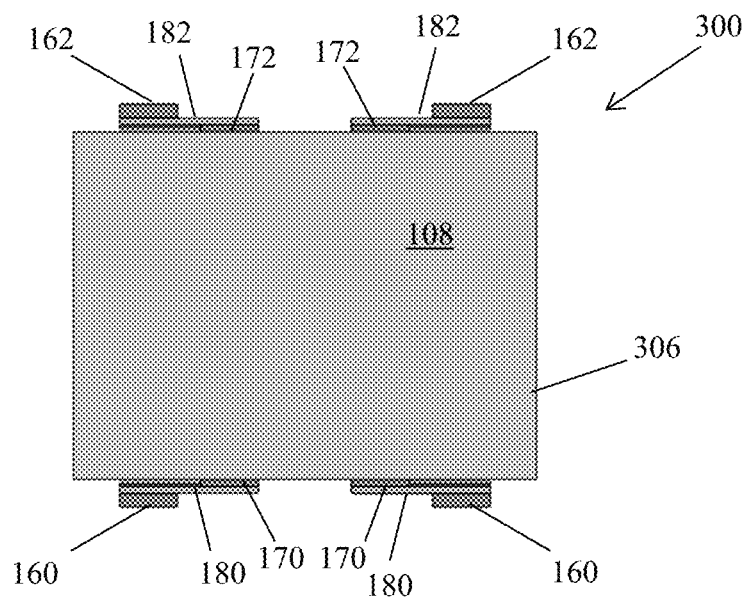
FIG. 11 is a top view of the surface mount, electromagnetic component assembly shown in FIGS. 9 and 10.
Figure 12:
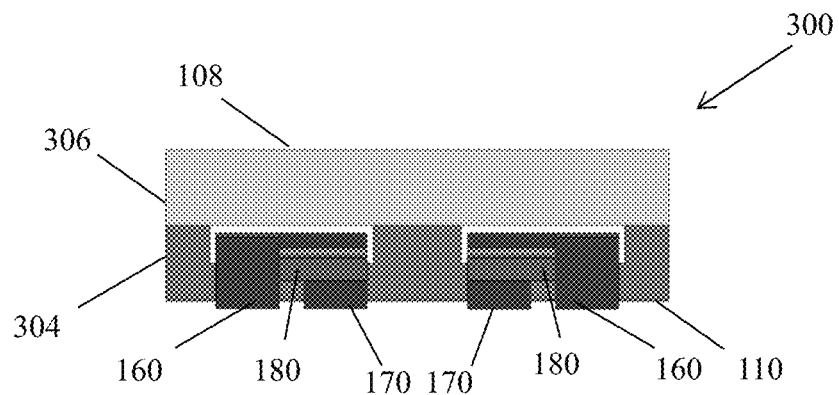
FIG. 12 is an end elevational view of the surface mount, electromagnetic component assembly shown in FIGS. 9 through 11.
Figure 13:
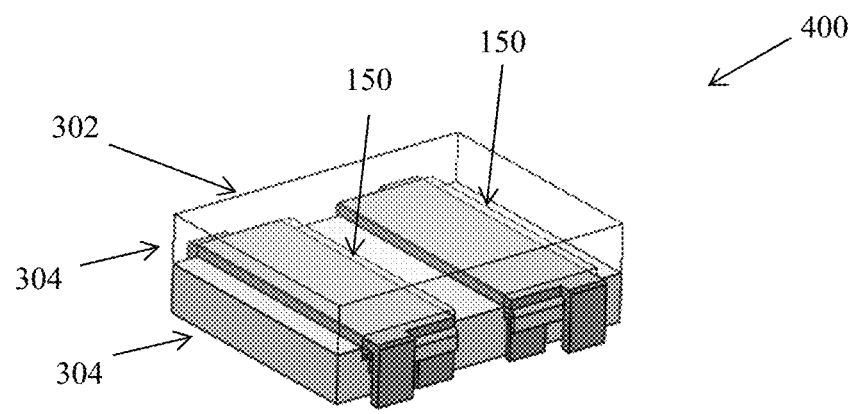
FIG. 13 is a top perspective view of a fourth exemplary embodiment of a surface mount, electromagnetic component assembly including a plurality of magnetically coupled windings.
Figure 14:
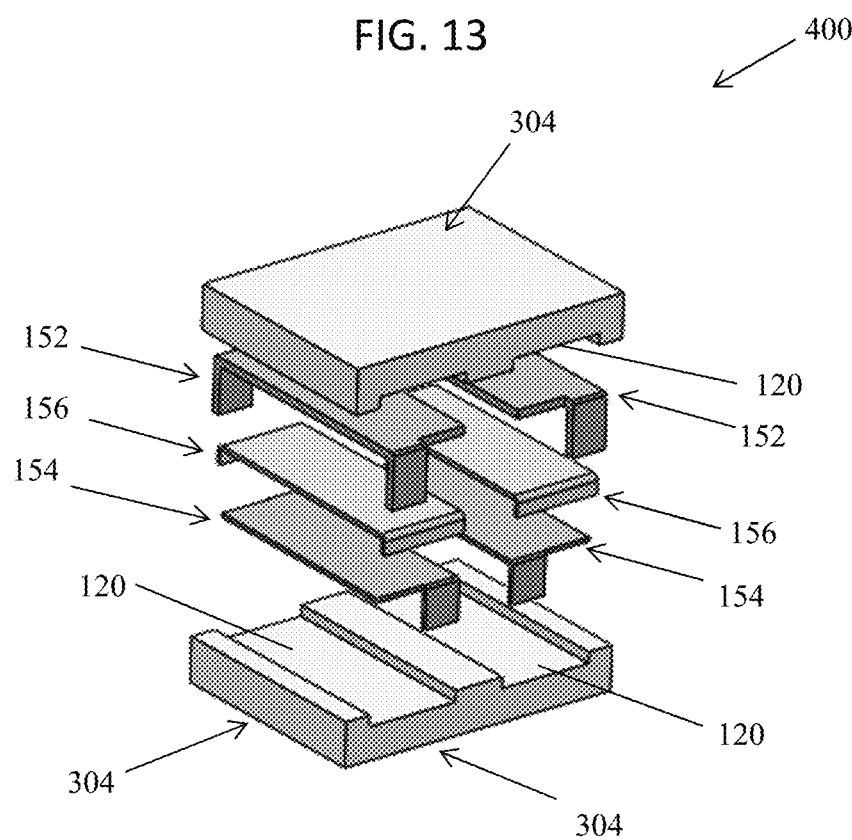
FIG. 14 is an exploded view of the surface mount, electromagnetic component assembly shown in FIG. 13.
Figure 15:
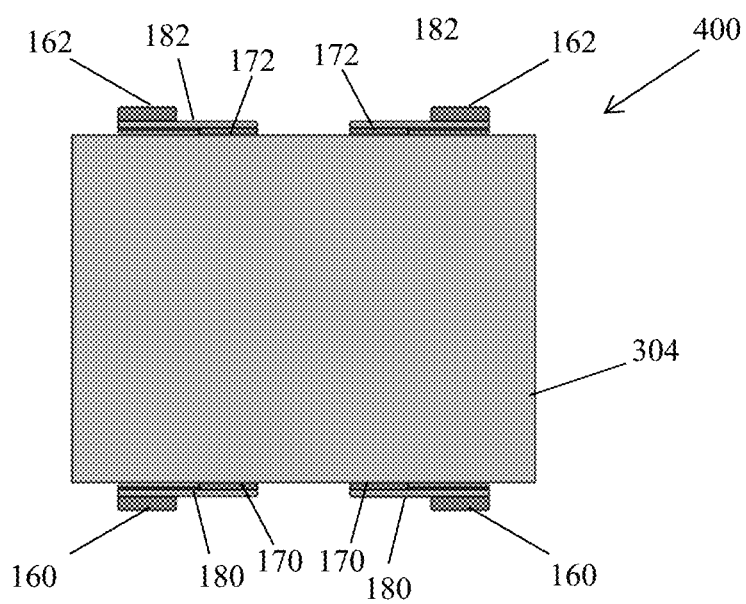
FIG. 15 is a top view of the surface mount, electromagnetic component assembly shown in FIGS. 13 and 14.
Figure 16:
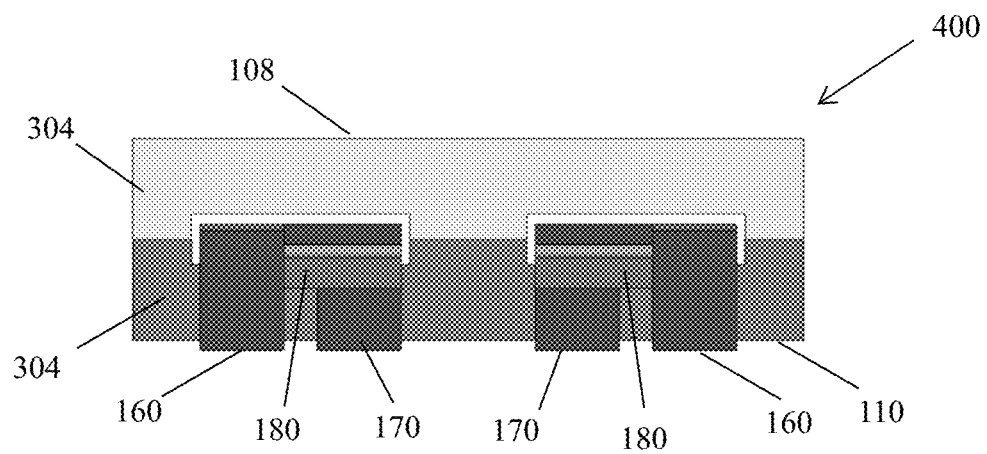
FIG. 16 is an end elevational view of the surface mount, electromagnetic component assembly shown in FIGS. 13 through 15.

The dual-winding arrangement 150 is received between the two U-core pieces 104 in the component 200, with a portion of the dual-winding arrangement 150 received in the channel 120 of each magnetic core piece 104 as shown in FIG. 8. That is, a lower portion of the dual-winding arrangement 150 is received and resides in the lower channel 120 of the lower magnetic core piece 104, and an upper portion of the dual-winding arrangement 140 is received and resides in the upper channel 120 of the upper core piece 104 in the assembled component 200. The depth of the channel 120 in each core piece 104 in the component 200 is shallower than in the core piece 104 in the component 100 as each channel need only accommodate a portion of the dual-winding arrangement 150, and the overall height dimension H of the component 200 when mounted to the circuit board 50 is reduced a bit more relative to the component 100. Because the dual-winding arrangement 150 is shared in the channel 120 of each core piece 104, the low profile of the component 200 is a bit less than or lower than the low profile of the component 100. Otherwise, the benefits of the components 100 and 200 are similar.

FIGS. 9 through 12 are various views of a third exemplary embodiment of a low profile surface mount electromagnetic component assembly 300 that may be used in addition to or in lieu of the components 100 or 200 described above on the circuit board 50.

The component 300 is a double wide version of the component 100 wherein a modular magnetic core piece 304 is enlarged in the width dimension relative to core piece 104 in the component 100, and two channels 120 are formed on the upper surface of the core piece 304 instead of one. As such, while the component 100 includes a U-core piece 104 the component 300 includes a double U-shaped core that accommodates two dual-winding arrangements 150 instead of one. A first dual-winding arrangement 150 is received in one channel 120 of the core piece 304 and a second dual-winding arrangement 150 is received in the other channel 120 in the core piece 304. An enlarged core piece 306 overlies the dual-winding arrangements 150 that are received in the respective channels 120. The core piece 306 is an enlarged version of the I-core piece 106 in the component 100 that overlies the core piece 304 and the dual-winding arrangements 150 received thereon. As such the dual-winding arrangements 150 are entirely received in the core piece 304. None of the dual-winding arrangements 150 are received in the core piece 306.

The component 300 including two sets of dual-winding arrangements 150 can be used on the circuit board and may connect to a four phase power system through the line and load-side circuit traces on the circuit board. Of course, in further embodiments the component may be provided with additional channels 120 and dual-winding arrangements to accommodate six or eight phase power systems. The component is generally scalable to include any number of dual-winding arrangements 150 to meet the needs of specific applications while still being economical to manufacture and while meeting performance standards.

FIGS. 13 through 16 are various view of a fourth exemplary embodiment of a low profile surface mount electromagnetic component assembly 400 that may be used in addition to or in lieu of the components 100, 200 or 300 described above on the circuit board 50.

The component 400 is a double wide version of the component 200 wherein the core pieces 304 are enlarged in the width dimension relative to core pieces 104 in the component 200, and two channels 120 are formed in each core piece 304 instead of one. As such, while the component 200 includes a pair of U-core pieces 104 the component 400 includes a pair of double U-shaped core pieces 304 that accommodate two dual-winding arrangements 150 instead of one. A first dual-winding arrangement 150 is received in one of the pair of aligned channels 120 of the core pieces 304 and a second dual-winding arrangement 150 is received in the other of the pair of aligned channels 120 in the core pieces 304. Because the dual-winding arrangements are shared in the channels 120 of each core piece 304, the height H of the component 400 may be reduced a bit further than the component 300.

The component 400 including two sets of dual-winding arrangements 150 can be used on the circuit board 50 and may connect to a four phase power system. Of course, the component may be provided with additional channels 120 and dual-winding arrangements to accommodate six or eight phase power systems. The component is generally scalable to include any number of dual-winding arrangements 150 to meet the needs of specific applications while still being economical to manufacture.

The benefits and advantages of the inventive concepts disclosed are now believed to have been amply illustrated in relation to the exemplary embodiments disclosed.

A low profile surface mount electromagnetic component for multi-phase electrical power circuitry implemented on a circuit board has been disclosed. The electromagnetic component includes a magnetic core structure including a top wall, a bottom wall, a first pair of opposed side walls interconnecting the top and bottom wall, and a second pair of opposed side walls interconnecting the first pair of side walls and the top and bottom walls, and at least one dual-winding arrangement in the magnetic core structure and configured to be surface mounted to the multi-phase electrical power circuitry on the circuit board with the bottom wall adjacent a plane of the circuit board. The at least one dual-winding arrangement includes: a first winding fabricated from an elongated conductor having a first thickness, the first winding including a first elongated planar main winding section extending linearly in a plane parallel to and spaced from the bottom wall and extending entirely across the magnetic core structure; a second winding fabricated from a conductor having a second thickness less than the first thickness, the second winding including a second elongated planar main winding section extending linearly in a plane parallel to and spaced from the plane of the first elongated planar main winding section of the first winding and extending entirely across the magnetic core structure; wherein one of the first elongated planar main winding section and the second elongated planar main winding section overlies the other in the magnetic core structure and wherein the first and second windings are magnetically coupled to one another; and a separator element separating the first elongated planar main winding section and the second elongated planar main winding section inside the magnetic core structure.

Optionally, the elongated planar main winding section of the first winding may include a first end, a second end, and first and second longitudinal sides interconnecting the first end and the second end; and the first winding may further include first and second legs each extending from the respective first and second ends of the elongated planar main winding section and perpendicular to the plane of the elongated planar main winding section, wherein the elongated planar main winding section is wider than the first and second legs such that the first and second legs depend from the first longitudinal side but not the second longitudinal side.

The elongated planar main winding section of the second winding may likewise optionally include a first end, a second end, and first and second longitudinal sides interconnecting the first end and the second end; and the second winding may further include first and second legs each extending from the respective first and second ends of the elongated planar main winding section and perpendicular to the plane of the elongated planar main winding section, wherein the elongated planar main winding section is wider than the first and second legs such that the first and second legs depend from the first longitudinal side but not the second longitudinal side.

The first and second legs of the first winding may be off-centered in the magnetic core structure and the first and second legs of the second winding may also be off-centered in the magnetic core structure. The first and second legs of the first winding may be spaced apart from the first and second legs on each one of the first or second pairs of opposed side walls. Each of the first and second legs in the first and second windings may project from the magnetic core structure by different amounts. The separator element may project from the magnetic core structure and separates the first and second legs of the first and second windings.

As further options, the magnetic core structure has a length dimension, a width dimension, and a height dimension relative to the circuit board; and the height dimension may be substantially less than the one of the width dimension and the length dimension. The magnetic core structure may include first and second magnetic core pieces, at least one of the first and second magnetic core pieces may be formed with a channel to receive at least one of the first and second elongated planar main winding sections of the at least one dual-winding arrangement. Both of the first and second magnetic core pieces may be formed with a channel to receive at least one of the first and second elongated planar main winding sections of the at least one dual-winding arrangement, or one of the first and second magnetic core pieces may be a flat and planar core piece.

One of the first and second magnetic core pieces may also be optionally formed with a first channel and a second channel, wherein the at least one dual-winding arrangement includes a first dual-winding arrangement received in the first channel and a second dual winding arrangement received in the second channel. Both of the first and second magnetic core pieces is formed with a first channel and a second channel, wherein the at least one dual-winding arrangement comprises a first dual-winding arrangement received in the first channel of each of the first and second magnetic core piece, and a second dual winding arrangement received in the second channel of each of the first and second magnetic core piece.

The separator element may optionally include a main planar section and first and second legs extending perpendicularly from respective ends of the main planar section. Each of the first and second windings may include first and second legs extending from respective ends of the elongated planar main winding section and perpendicular to the plane of the elongated planar main winding section. The first and second legs of the separator may be wider than each of the first and second legs of the first and second windings. The first and second legs of one of the first and second windings extend exterior to the respective first and second legs of the separator. The first and second legs of one of the first and second windings may extend interior to the respective first and second legs of the separator. The separator may have a first axial length that is more than an axial length of one of the first and second windings and less than an axial length of the other of the first and second windings.

A physical air gap may optionally extend between a portion of the dual-winding arrangement and the magnetic core structure. The first elongated planar main winding section, the second elongated planar main winding section, and the separator may have an equal width and are aligned with one another in the electromagnetic component.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A low profile surface mount electromagnetic component for multi-phase electrical power circuitry implemented on a circuit board, the electromagnetic component comprising:

a magnetic core structure including a top wall, a bottom wall, a first pair of opposed side walls interconnecting the top and bottom wall, and a second pair of opposed side walls interconnecting the first pair of side walls and the top and bottom walls; and at least one dual-winding arrangement in the magnetic core structure and configured to be surface mounted to the multi-phase electrical power circuitry on the circuit board with the bottom wall adjacent a plane of the circuit board, wherein the at least one dual-winding arrangement comprises:

a first winding fabricated from an elongated conductor having a first thickness, the first winding including a first elongated planar main winding section extending linearly in a first plane parallel to and spaced from the bottom wall and extending entirely across the magnetic core structure and a first set of legs, the first set of legs extending from the first elongated planar main winding section perpendicularly to the first plane associated with the first elongated planar main winding section, wherein the first set of legs has a first height measured along a height dimension relative to the circuit board, and wherein the first elongated planar main winding section comprises a first top surface having a first area;

a second winding fabricated from a conductor having a second thickness less than the first thickness, the second winding including a second elongated planar main winding section extending linearly in a second plane parallel to and spaced from the first plane associated with the first elongated planar main winding section of the first winding and extending entirely across the magnetic core structure, wherein the second elongated planar main winding section comprises a second top surface having a second area, wherein the second winding further includes a second set of legs, which the second set of legs extending from the second elongated planar main winding section perpendicularly to the second plane associated with the second elongated planar main winding section, wherein the second set of legs has a second height measured along the height dimension relative to the circuit board, and wherein portions of the first set of legs that are facing away from the magnetic core structure do not overlap with portions of the second set of legs that are facing away from the magnetic core structure;

wherein one of the first elongated planar main winding section and the second elongated planar main winding section overlies the other in the magnetic core structure, wherein the first area of the first top surface and the second area of the second top surface are entirely overlying one another, respectively, and wherein the first and second windings are magnetically coupled to one another; and a separator element separating the first elongated planar main winding section and the second elongated planar main winding section inside the magnetic core structure, wherein the separator element includes an elongated planar main section extending linearly in a third plane parallel to and spaced from the bottom wall and a third set of legs, the third set of legs extending from the elongated planar main section perpendicularly to the third plane associated with the elongated planar main section, wherein the third set of legs has a third height measured along the height dimension relative to the circuit board, wherein the third height is less than the first height and the second height, and wherein the third set of legs extend exterior to the second set of legs of the second winding and interior to the first set of legs of the first winding.

2. The electromagnetic component of claim 1, wherein the elongated planar main winding section of the first winding includes a first end, a second end, and first and second longitudinal sides interconnecting the first end and the second end; and wherein the elongated planar main winding section is wider than the first set of legs such that the first set of legs depend from the first longitudinal side but not the second longitudinal side.

3. The electromagnetic component of claim 2, wherein the elongated planar main winding section of the second winding includes a first end, a second end, and first and second longitudinal sides interconnecting the first end and the second end; and wherein the elongated planar main winding section is wider than the second set of legs such that the second set of legs depend from the first longitudinal side but not the second longitudinal side.

4. The electromagnetic component of claim 3, wherein the first and second legs of the first winding are off-centered in the magnetic core structure and wherein the first and second legs of the second winding are off-centered in the magnetic core structure, and wherein the first and second legs of the first winding being spaced apart from the first and second legs on each one of the first or second pairs of opposed side walls.

5. The electromagnetic component of claim 4, wherein each of the first and second legs in the first and second windings respectively project from the magnetic core structure by different amounts.

6. The electromagnetic component of claim 5, wherein the separator element projects from the magnetic core structure and separates the first and second legs of the first and second windings.

7. The electromagnetic component of claim 1,
wherein the magnetic core structure has a length dimension, a width dimension, and a height dimension relative to the circuit board; and
wherein the height dimension is substantially less than the one of the width dimension and the length dimension.

8. The electromagnetic component of claim 7, wherein the magnetic core structure comprises first and second magnetic core pieces, at least one of the first and second magnetic core pieces being formed with a channel to receive at least one of the first and second elongated planar main winding sections of the at least one dual-winding arrangement.

9. The electromagnetic component of claim 8, wherein both of the first and second magnetic core pieces are formed with a channel to receive at least one of the first and second elongated planar main winding sections of the at least one dual-winding arrangement.

10. The electromagnetic component of claim 8, wherein one of the first and second magnetic core pieces is a flat and planar core piece.

11. The electromagnetic component of claim 8, wherein one of the first and second magnetic core pieces is formed with a first channel and a second channel, wherein the at least one dual-winding arrangement comprises a first dual-winding arrangement received in the first channel and a second dual winding arrangement received in the second channel.

12. The electromagnetic component of claim 11, wherein both of the first and second magnetic core pieces is formed with a first channel and a second channel, wherein the at least one dual-winding arrangement comprises a first dual-winding arrangement received in the first channel of each of the first and second magnetic core piece, and a second dual winding arrangement received in the second channel of each of the first and second magnetic core piece.

13. The electromagnetic component of claim 1, wherein the first and second legs of the separator element are wider than each of the first and second legs of the first and second windings.

14. The electromagnetic component of claim 1, wherein the first and second legs of one of the first and second windings extend interior to the respective first and second legs of the separator.

15. The electromagnetic component of claim 1, wherein the separator has a first axial length that is more than an axial length of one of the first and second windings and less than an axial length of the other of the first and second windings.

16. The electromagnetic component of claim 1, wherein a physical air gap extends between a portion of the dual-winding arrangement and the magnetic core structure.

17. The electromagnetic component of claim 1, wherein the first elongated planar main winding section, the second elongated planar main winding section, and the separator have an equal width and are aligned with one another in the electromagnetic component.

\* \* \* \* \*